United States Patent
Brintzinger et al.

(10) Patent No.: US 7,335,591 B2
(45) Date of Patent: Feb. 26, 2008

(54) METHOD FOR FORMING THREE-DIMENSIONAL STRUCTURES ON A SUBSTRATE

(75) Inventors: Axel Brintzinger, Dresden (DE); Ingo Uhlendorf, Dresden (DE)

(73) Assignee: Infineon Technologies AG, Munich (DE)

( * ) Notice: Subject to any disclaimer, the term of this patent is extended or adjusted under 35 U.S.C. 154(b) by 428 days.

(21) Appl. No.: 10/733,217

(22) Filed: Dec. 11, 2003

(65) Prior Publication Data

US 2004/0166670 A1 Aug. 26, 2004

(30) Foreign Application Priority Data

Dec. 11, 2002 (DE) ................. 102 58 094

(51) Int. Cl.
*H01L 21/44* (2006.01)
(52) U.S. Cl. .............. 438/652; 438/677; 438/686; 438/687
(58) Field of Classification Search ......... 438/613, 438/652, 674, 677, 656, 685–687
See application file for complete search history.

(56) References Cited

U.S. PATENT DOCUMENTS

| 4,813,129 | A |   | 3/1989  | Karnezos          |         |
|-----------|---|---|---------|-------------------|---------|
| 5,096,550 | A |   | 3/1992  | Mayer et al.      |         |
| 5,590,460 | A |   | 1/1997  | DiStefano et al.  |         |
| 5,607,818 | A |   | 3/1997  | Akram et al.      |         |
| 5,893,966 | A |   | 4/1999  | Akram et al.      |         |
| 5,907,791 | A |   | 5/1999  | Cappuzzo et al.   |         |
| 5,949,141 | A | * | 9/1999  | Farnworth et al.  | 257/737 |
| 6,084,297 | A | * | 7/2000  | Brooks et al.     | 257/698 |
| 6,114,097 | A | * | 9/2000  | Malba et al.      | 430/314 |
| 6,284,563 | B1| * | 9/2001  | Fjelstad          | 438/106 |
| 2001/0011605 | A1 |  | 8/2001 | Distefano et al.  |         |
| 2001/0044225 | A1 | * | 11/2001 | Eldridge et al.  | 439/66  |
| 2002/0093082 | A1 | * | 7/2002 | Miyamoto et al.   | 257/678 |
| 2003/0067755 | A1 |  | 4/2003 | Halmerl et al.    |         |
| 2003/0079989 | A1 | * | 5/2003 | Klocke et al.     | 204/471 |
| 2004/0087131 | A1 | * | 5/2004 | Brintzinger et al.| 438/614 |
| 2006/0019027 | A1 | * | 1/2006 | Eldridge et al.   | 427/96.8|

FOREIGN PATENT DOCUMENTS

| DE | 102 58 081 A1 | * | 7/2004 |
| EP | 0 295 914 A2 |   | 12/1988 |
| EP | 0 803 905 A2 |   | 10/1997 |
| WO | WO 01/75969 A1 |  | 10/2001 |

* cited by examiner

*Primary Examiner*—Zandra V. Smith
*Assistant Examiner*—Toniae M Thomas
(74) *Attorney, Agent, or Firm*—Slater & Matsil, L.L.P.

(57) ABSTRACT

A method of forming a resist layer on a non-planar surface of a substrate includes placing the non-planar surface into an electrophoretic resist. While the non-planar surface is in the electrophoretic resist, an electrical voltage is applied between the substrate and the electrophoretic resist. The non-planar surface can then be removed from the electrophoretic resist.

23 Claims, 2 Drawing Sheets

METHOD FOR FORMING THREE-DIMENSIONAL STRUCTURES ON A SUBSTRATE

TECHNICAL FIELD

The present invention relates generally to electronic components, and more particularly to a system and method for forming three-dimensional structures on a substrate.

BACKGROUND

The increasing integration of semiconductor components and the continually rising number of electrical connections between wafers and the carrier elements thereof and, in particular, the required miniaturization in the sense of assemblies that are as flat as possible have led to the use of the direct contact-connection of the semiconductor chips on the carrier elements (e.g., flip-chip bonding).

However, in order to enable a direct contact-connection of semiconductor chips on carrier elements, such as a PCB (printed circuit board), it is necessary to produce on the semiconductor chip 3-D structures which end at their respective highest point in a gold-plated contact element and are connected to a bonding pad of the wafer via an interconnect. This gold-plated contact area may then be provided with a solder material and be electrically and mechanically connected to a corresponding soldering contact on the PCB.

In order to achieve a certain compensation of mechanical loading on the finished assembly, e.g., caused by different thermal expansion coefficients of the individual components or during the handling thereof, the basic structure of the 3-D structure may be produced from a compliant material, e.g., silicone, thus resulting in a three-dimensional, mechanically flexible structure which is fixedly connected to the wafer.

The interconnects (reroute layer) used for the electrical connection between the bonding pad and the 3-D structure are constructed on a seed layer, on which is grown a copper interconnect and, above the latter, a nickel layer, which serves to protect the copper layer from corrosion.

In order to achieve a solderability of the contact element, the nickel layer must be coated with gold in this region at least on the tip of the 3-D structure.

The required patterning of all the layers and functional elements is usually realized by photolithographic processes.

The functional elements are patterned after the deposition of a photoresist on the wafer, e.g., by the dispensing or printing and subsequent exposure and development of the photoresist to produce a resist mask. A metallization made of copper, nickel and gold may then be constructed within the openings of the resist mask on the seed layer. Afterwards, the gold layer must be partially covered by a lithography in such a way that the undesired regions of the gold layer can be selectively etched and, finally, all that remains is a gold layer on the tip of the 3-D structure.

This method can be represented in summary by the following process flow:
  deposition of the seed layer;
  EPR1 (epoxy photoresist 1): coating and patterning of the EPR1 photoresist mask (lithography step 1);
  reroute plating, production of the copper/nickel layer on the seed layer;
  coating of the reroute layer with gold;
  EPR2 (epoxy photoresist 2): coating and patterning of the EPR2 photoresist mask (lithography step 2); and
  selective etching of the Au layer (wet etching or removal/stripping).

In this method, the application of the photoresist is highly problematic due to the 3-D structures on the wafer. The formation of the 3-D structures on the wafer leads to a greatly fissured surface, so that, during the application of a photoresist by the customary coating methods such as printing or dispensing, it cannot be ensured that the thickness of the applied photoresist is the same at every point of the surface in spite of the structure of the wafer surface. Thus, it must be expected, for example, that the photoresist will run down at least partially on the 3-D structures and, consequently, have an excessively small thickness on the 3-D structures as a result. It must also be expected that the photoresist will uniformly fill, or even out, depressions on the wafer, so that a larger thickness of the photoresist is to be noted in the region of the depressions.

However, in order to be able to produce structures suitable for subsequent processing steps, e.g., metallization, by means of the photolithography on the wafer, it must be ensured that the photoresist is distributed as uniformly as possible with a uniform thickness along the structure after the application on the wafer. That is particularly difficult in the case of 3-D structures, as already explained. The problems multiply if a plurality of photolithographic steps have to be carried out one after the other.

This problem also exists in a similar manner in the case of the photolithographic patterning of printed circuit boards (PCBs). The process of coating with a resist is effected by electrodeposition of an electrophoretic resist, in this case the entire printed circuit board being suspended perpendicularly into the electrophoretic resist. This is necessary in order to prevent the unavoidable outgasing of hydrogen from leading to disturbances of the coating (pinholes) during the coating operation. However, since it is absolutely necessary to prevent the rear side of the printed circuit board from likewise being coated with the resist, the rear side of the printed circuit board is covered with the aid of a film or the like prior to coating.

It has been shown, however, that transferring this method to the patterning of 3-D structures and effecting a reroute layer on wafers in this way is not suitable since in practice it is virtually impossible to suspend the wafers perpendicularly into an electrophoretic resist and at the same time prevent the wafer's rear side from being coated.

SUMMARY OF THE INVENTION

A preferred embodiment of the present invention relates to a method for forming 3-D structures on wafers in the form of bumps distributed on the wafer. Each of these bumps can be electrically connected to a bonding pad on the wafer via an interconnect by realizing the 3-D structures and the interconnect by photolithographic processes by means of a photoresist mask patterned by exposure and development and by subsequent layer construction by metallization.

Another preferred embodiment of the invention provides a method for forming 3-D structures on wafers which can be realized simply and reliably and with which a uniform coating with a completely uniform layer thickness is achieved over the surface of the wafer.

Advantages of various embodiments of the invention can be achieved, in the case of a method of the type mentioned in the introduction, by virtue of the fact that an electrophoretic resist is used as the photoresist, and the coating of the wafer with the electrophoretic resist is performed by dipping the active side of the wafer into the resist and by subsequently applying an electrical voltage between the wafer and the electrophoretic resist.

It has surprisingly been shown that it is possible to dip the wafer into the electrophoretic resist on the active side and to perform the desired coating with the photoresist by applying an electrical voltage. In particular, it has been shown that even very small structures on the wafer are coated with a uniform thickness.

Preferably, the active side of the wafer is dipped into the electrophoretic resist in a horizontal arrangement of the wafer. This achieves a largely uniform distribution of the hydrogen bubbles over the area of the wafer.

Furthermore, the wafer rear side is protected from wetting during the process of dipping into the electrophoretic resist. This is possible in a simple manner by means of suitable receptacle devices and exact positioning during the dipping operation.

In order to prevent gas bubbles from collecting on the surface of the resist during the layer deposition, the wafer may be caused to rotate during the coating operation into the electrophoretic resist.

In another possible method, a flow is produced in the electrophoretic resist at least below the wafer, so that the gas bubbles are transported away from the surface of the resist.

A favorable alternative includes causing the electrophoretic resist to move (e.g., rotate) in the region of the surface of the wafer, this rotation being able to be produced in a simple manner by means of a stirrer. This also enables the gas bubbles to be removed from the surface of the resist.

In a further refinement of the invention, the wafer is removed after the process of coating with the electrophoretic resist in a horizontal position and the coating is completed by a thermal treatment, for example baking or annealing. As a result, the coating acquires a sufficiently solid consistency while maintaining the uniform layer thickness, so that the wafer can be turned over and processed further.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
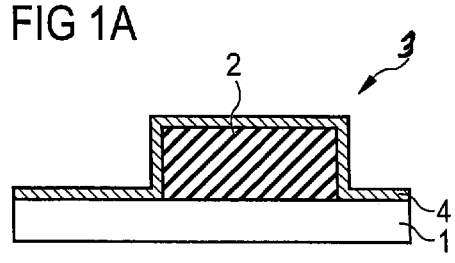
FIG. 1A shows a sectional illustration of a detail from a 3-D structure coated with a seed layer on a wafer.
Figure 1B:
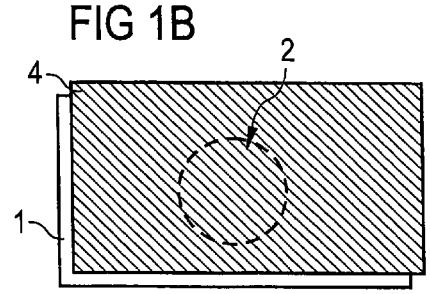
FIG. 1B shows the plan view of the 3-D structure according to FIG. 1A.

FIGS. 1A and 1B illustrate a detail from a substrate or wafer 1, in which a compliant element 2 as the basic element of the 3-D structure 3 to be produced is fixed on the wafer 1. In one embodiment, the compliant element 2 is made of a compliant material, e.g., having a Young's Modulus of less than 5 MPa. The preferred material is silicone. The compliant element 2 provides forgiveness in the X & Y directions (e.g., helping to compensate for thermal mismatch) and is compliant in the Z direction (e.g., helping with test and burn-in). The compliant element 2 is illustrated as being a rectangular structure including relatively sharp edges. It is understood that other shapes, such as curved structures, can be made.

In the preferred embodiment, the compliant element 2 is one of a number of bumps that is used to provide electrical connection between a semiconductor chip and a circuit board. For example, the chip could be a dynamic random access memory (DRAM) that includes center contact pads. The contact pads connect to internal circuitry (not shown) to provide an electrical path to circuits outside of the chip. The bumps provide a soft physical interconnect between the chip and the board (not shown) to which the chip will be secured.

Redistribution conductors (see e.g., element 9 in FIG. 5B) serve as a reroute layer to electrically couple each contact pad (not shown) on the chip with a corresponding terminal that overlies one of the bumps 2. The terminal is the portion of the redistribution on top of the bump. The redistribution helps to relax the pitch of the pads since the geometry on the board (on which the chip is mounted) is greater than that of the chip. One goal is to provide a redistribution wiring from the contact pads to the bumps. The following description provides an improved method of patterning this redistribution wiring.

Returning to FIGS. 1A and 1B, in order to prepare for the subsequent metallization, a seed layer 4 is situated on the wafer 1 and the compliant element 2. In order to be able to perform the metallization at the necessary locations on the wafer 1, an electrophoretic resist 5 is applied on the wafer 1 (see FIG. 2A). The coating of the wafer 1 may be performed by dipping the active side of the wafer into the electrophoretic resist situated in a container and by subsequently applying an electrical voltage between the wafer 1 and the electrophoretic resist in the container. In this context, the active side of the wafer is the side of the wafer that includes the compliant element 2, regardless of where the circuitry (e.g., transistors) is formed. Since, with increasing layer deposition on the wafer, the electrical resistance increases at the same time, the coating is automatically stopped after a sufficiently high resistance has been reached.

The active side of the wafer 1 is dipped into the electrophoretic resist in a horizontal position of the wafer 1. This results in a largely uniform distribution of the hydrogen bubbles over the area of the wafer 1 during the coating process. Furthermore, the rear side of the wafer should be protected from wetting during the coating operation. This can be achieved in a simple manner by means of suitable receptacle devices and exact positioning during the dipping operation.

In order to prevent the gas bubbles from collecting on the surface of the resist 5 during the layer deposition, the wafer 1 may be caused to move (e.g., rotate) during the coating operation. A comparable effect is achieved if a flow is produced in the electrophoretic resist at least below the wafer 1, so that the gas bubbles are transported away from the surface of the deposited resist 5. Thus, the electrophoretic resist could be caused to move (e.g., rotate) in the region of the surface of the wafer 1. This can be produced in a simple manner by means of a stirrer.

Figure 2A:
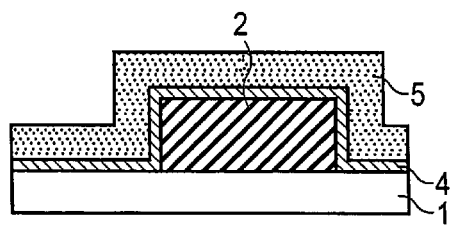
FIG. 2A shows a detail from the wafer coated with an electrophoretic resist.
Figure 2B:
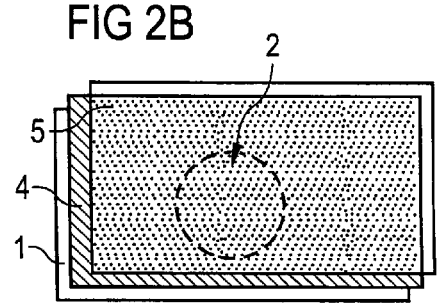
FIG. 2B shows the plan view of the wafer according to FIG. 2A.

Coating the wafer 1 by electrodeposition results in a completely uniform coating with the resist 5 on the 3-D structures as well. Since the resist does not yet have sufficient strength after coating, it is desirable to stabilize it by means of a thermal treatment, for example by baking or annealing. As a result, the resist 5 on the wafer 1 acquires a sufficiently solid consistency while maintaining the uniform layer thickness so that the wafer 1 can be turned over and processed further (FIGS. 2A and 2B).

The coating of the wafer 1 with the resist 5 may then be followed by the further patterning firstly of the resist 5 by means of customary photolithography in order to produce a resist mask for the subsequent metallization steps. The completed resist mask can be seen from FIGS. 3A and 3B. In this case, a first conductive layer 6 is deposited on the portion of the seed layer 4 that is not covered by mask 5 and a second conductive layer 7 is deposited over the first conductive layer 6. In the preferred embodiment, a copper layer 6 is deposited on the seed layer 4 and a nickel layer 7 is deposited thereabove by means of generally known methods. In other embodiments, other conductive materials can be used.

Figure 4A:
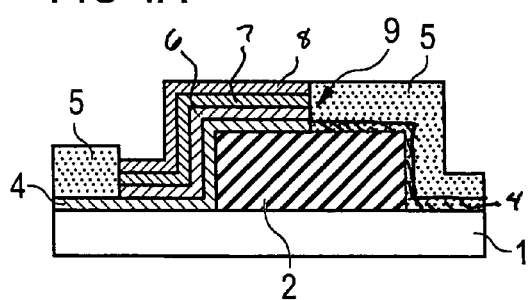
FIG. 4A shows a detail from the wafer after the deposition of gold on the interconnect.
Figure 4B:
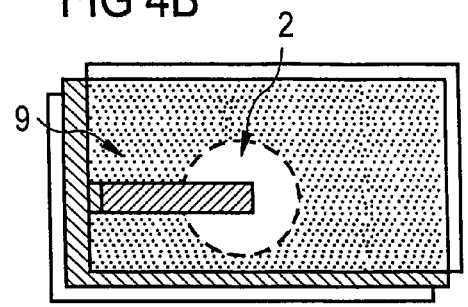
FIG. 4B shows the plan view of the wafer according to FIG. 4A.

Referring now to FIGS. 4A and 4B, the reroute layer is shown completed with an additional conductive layer 8. In the preferred embodiment, a gold layer 8 is formed above the nickel layer 7 by means of generally known methods. In other embodiments, other conductive materials can be used.

Figure 5A:
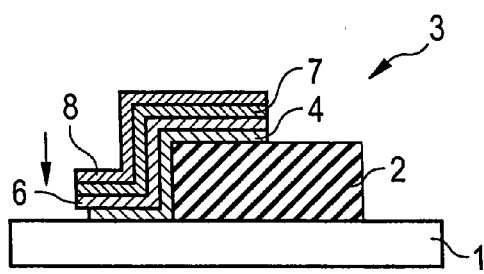
FIG. 5A shows a detail from the wafer after the stripping of the electrophoretic resist and the etching of the seed layer.
Figure 5B:
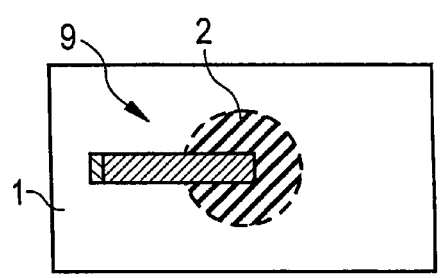
FIG. 5B shows the plan view of the wafer according to FIG. 5A.

In the final method step, the layers that are no longer required are removed as shown in FIGS. 5A and 5B. They are the resist 5 of the resist mask, which can be removed by stripping, and the seed layer 4, which is removed by wet etching.

Figure 3A:
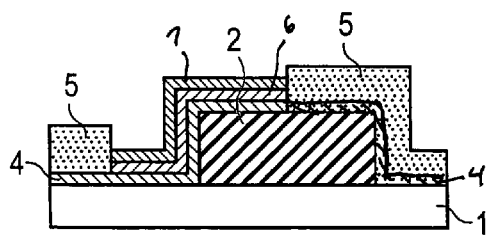
FIG. 3A shows a detail from the wafer after the photolithographic patterning of the electrophoretic resist and the metallization of the interconnect.
Figure 3B:
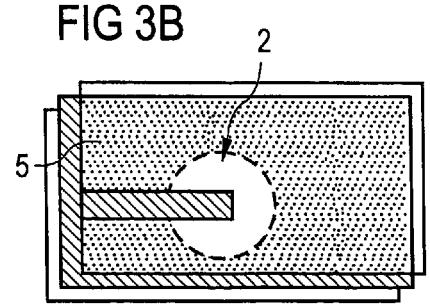
FIG. 3B shows the plan view of the wafer according to FIG. 3A.

In the embodiment of FIGS. 1-5, the photoresist 5 was used to expose a portion of a seed layer 4 (see e.g., FIG. 3A). In other embodiments, the photoresist 5 can be patterned to expose portions of a conductor 4 that will be removed. For example, the reroute layer could include one or more metal layers (e.g., aluminum or a compound including aluminum). In that case the resist 5 would protect portions of the reroute layer 9 while other portions of conductive layer 4 are removed.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a plurality of three-dimensional structures on a substrate, the method comprising:

providing a wafer with bumps distributed on a surface of the wafer, said bumps on said wafer comprising compliant elements;

forming a resist over the surface of the wafer including the bumps by coating the surface of the wafer with an electrophoretic resist by dipping the surface of the wafer into the resist and by applying an electrical voltage between the wafer and the electrophoretic resist; and patterning said resist and forming a conductor overlying one of said bumps to provide a three dimensional structure having a terminal supported by one of said compliant bumps.

2. The method of claim 1 further comprising:

removing the surface of the wafer with the bumps from the electrophoretic resist; and patterning the electrophoretic resist after removing the surface of the wafer from the electrophoretic resist.

3. The method of claim 2 and further comprising heating the substrate after removing the wafer surface form the electrophoretic resist.

4. The method of claim 2 wherein the conductor electrically connects a bonding pad on the wafer to said terminal located on the bumps.

5. The method of claim 1 and further comprising:

patterning the resist to expose a seed layer over the surface of the wafer; and forming a plurality of conductors over the exposed seed layer.

6. The method of claim 5 wherein forming a plurality of conductors comprises:

forming a copper layer over portions of the seed layer not covered by the electrophoretic resist;

forming a nickel layer over the copper layer; and forming a gold layer over the nickel layer.

7. A method for forming a plurality of three-dimensional structures on a semiconductor wafer, the method comprising:

providing a wafer with bumps distributed on a surface of the wafer;

forming a resist over the surface of the wafer including the bumps by coating the surface of the wafer with an electrophoretic resist by dipping the surface of the wafer into the resist and by applying an electrical voltage between the wafer and the electrophoretic resist; and patterning the resist to expose the surface of the wafer and forming a plurality of conductors over the exposed surface of the wafer, said plurality of conductors comprising a reroute layer electrically coupling a contact pad formed on the semiconductor wafer to a terminal on the surface of the wafer.

8. The method of claim 7 wherein said step of exposing the surface of the wafer exposes a seed layer.

9. A method for forming a plurality of three-dimensional structures on a substrate, the method comprising:

providing a wafer with bumps distributed on a surface of the wafer;

forming a resist over the surface of the wafer including the bumps by coating the surface of the wafer with an electrophoretic resist by dipping the surface of the wafer into the resist and by applying an electrical voltage between the wafer and the electrophoretic resist;

patterning the resist to expose an underlying surface; and forming a plurality of conductors over the exposed said underlying surface wherein the plurality of conductors electrically connect bonding pads on the wafer to terminals located on the bumps.

10. The method of claim 9 and further comprising:
removing the surface of the wafer with the bumps from the electrophoretic resist; and
patterning the electrophoretic resist after removing the surface of the wafer from the electrophoretic resist.

11. The method of claim 10 and further comprising heating the substrate after removing the wafer surface from the electrophoretic resist.

12. The method of claim 9 wherein forming a plurality of conductors comprises:
forming a copper layer over portions of the seed layer not covered by the electrophoretic resist;
forming a nickel layer over the copper layer; and
forming a gold layer over the nickel layer.

13. The method of claim 9 and further comprising causing the wafer surface with the bumps to be moved relative to the electrophoretic resist while the wafer surface is in the electrophoretic resist.

14. The method of claim 13 wherein the wafer surface is rotated while the wafer surface is in the electrophoretic resist.

15. The method of claim 13 wherein the electrophoretic resist is stirred while the wafer surface is in the electrophoretic resist.

16. The method of claim 9 wherein the surface of the wafer is dipped into the electrophoretic resist in a horizontal arrangement of the wafer.

17. The method of claim 16 wherein a rear side of the wafer is protected from wetting during the process of dipping into the electrophoretic resist.

18. The method of claim 9 wherein the wafer is caused to rotate during the coating operation.

19. The method of claim 13 wherein a flow is produced at least below the wafer in the electrophoretic resist during the coating operation.

20. The method of claim 19 wherein the electrophoretic resist is caused to rotate in a region of the surface of the wafer.

21. The method of claim 20 wherein the rotation of the electrophoretic resist is produced by a stirrer.

22. The method of claim 13 wherein the wafer is removed in a horizontal position after the process of coating with the electrophoretic resist and the coating is baked thermally.

23. The method of claim 9 wherein said step of exposing an underlying surface exposes a seed layer.

* * * * *

UNITED STATES PATENT AND TRADEMARK OFFICE
CERTIFICATE OF CORRECTION

PATENT NO. : 7,335,591 B2
APPLICATION NO. : 10/733217
DATED : February 26, 2008
INVENTOR(S) : Brintzinger et al.

It is certified that error appears in the above-identified patent and that said Letters Patent is hereby corrected as shown below:

On the Title Page, Item (56) References Cited, U.S. PATENT DOCUMENTS, 14$^{th}$ entry, delete "Halmerl" and insert --Haimerl--.
In Col. 6, line 20, delete "form" and insert --from--.
In Col.7, line 2, delete "tenninals" and insert --terminals--.
In Col. 8, line 10, delete "13" and insert --9--.
In Col. 8, line 19, delete "13" and insert --9--.

Signed and Sealed this

Tenth Day of June, 2008

JON W. DUDAS
*Director of the United States Patent and Trademark Office*